United States Patent
Ahn

(10) Patent No.: US 8,193,023 B2
(45) Date of Patent: Jun. 5, 2012

(54) UNIT PIXEL OF IMAGE SENSOR HAVING THREE-DIMENSIONAL STRUCTURE AND METHOD FOR MANUFACTURING THE SAME

(75) Inventor: Heui-Gyun Ahn, Yecheon-gun (KR)

(73) Assignee: Siliconfile Technologies Inc., Seoul (KR)

( * ) Notice: Subject to any disclaimer, the term of this patent is extended or adjusted under 35 U.S.C. 154(b) by 240 days.

(21) Appl. No.: 12/756,696

(22) Filed: Apr. 8, 2010

(65) Prior Publication Data

US 2010/0258890 A1 Oct. 14, 2010

(30) Foreign Application Priority Data

Apr. 10, 2009 (KR) .................. 10-2009-0031351

(51) Int. Cl.
- H01L 23/02 (2006.01)
- H01L 29/40 (2006.01)
- H01L 21/00 (2006.01)

(52) U.S. Cl. ............ 438/48; 438/59; 257/232; 257/234; 257/292; 257/686; 257/778; 257/E21.503; 257/E21.511; 257/E27.13; 257/E27.131; 257/E27.097

(58) Field of Classification Search .......... 257/232, 257/234, 292, E27.13, E27.133, E27.141, 257/E21.503, E21.511, E31.097, 778, 686; 438/48, 59

See application file for complete search history.

(56) References Cited

U.S. PATENT DOCUMENTS

| | | | |
|---|---|---|---|
| 2005/0161795 A1 * | 7/2005 | Tong et al. | 257/686 |
| 2008/0303172 A1 | 12/2008 | Bauer et al. | |
| 2010/0155932 A1 * | 6/2010 | Gambino et al. | 257/698 |

FOREIGN PATENT DOCUMENTS

| | | |
|---|---|---|
| JP | 2000-260733 A | 9/2000 |
| KR | 1020060108378 A | 10/2006 |
| WO | 2006/109937 A1 | 10/2006 |

\* cited by examiner

*Primary Examiner* — Long Tran
(74) *Attorney, Agent, or Firm* — Kile Park Goekjian Reed & McManus PLLC

(57) ABSTRACT

A unit pixel of an image sensor having a three-dimensional structure includes a first chip and a second chip which are stacked, one of the first chip and the second chip having a photodiode, and the other of the first chip and the second chip having a circuit for receiving information from the photodiode and outputting received information. The first chip includes a first pad which is projectedly disposed on an upper surface of the first chip in such a way as to define a concavo-convex structure, and the second chip includes a second pad which is depressedly disposed on an upper surface of the second chip in such a way as to define a concavo-convex structure corresponding to the concavo-convex structure of the first chip. The first chip and the second chip are mated with each other through bonding of the first pad and the second pad.

13 Claims, 9 Drawing Sheets

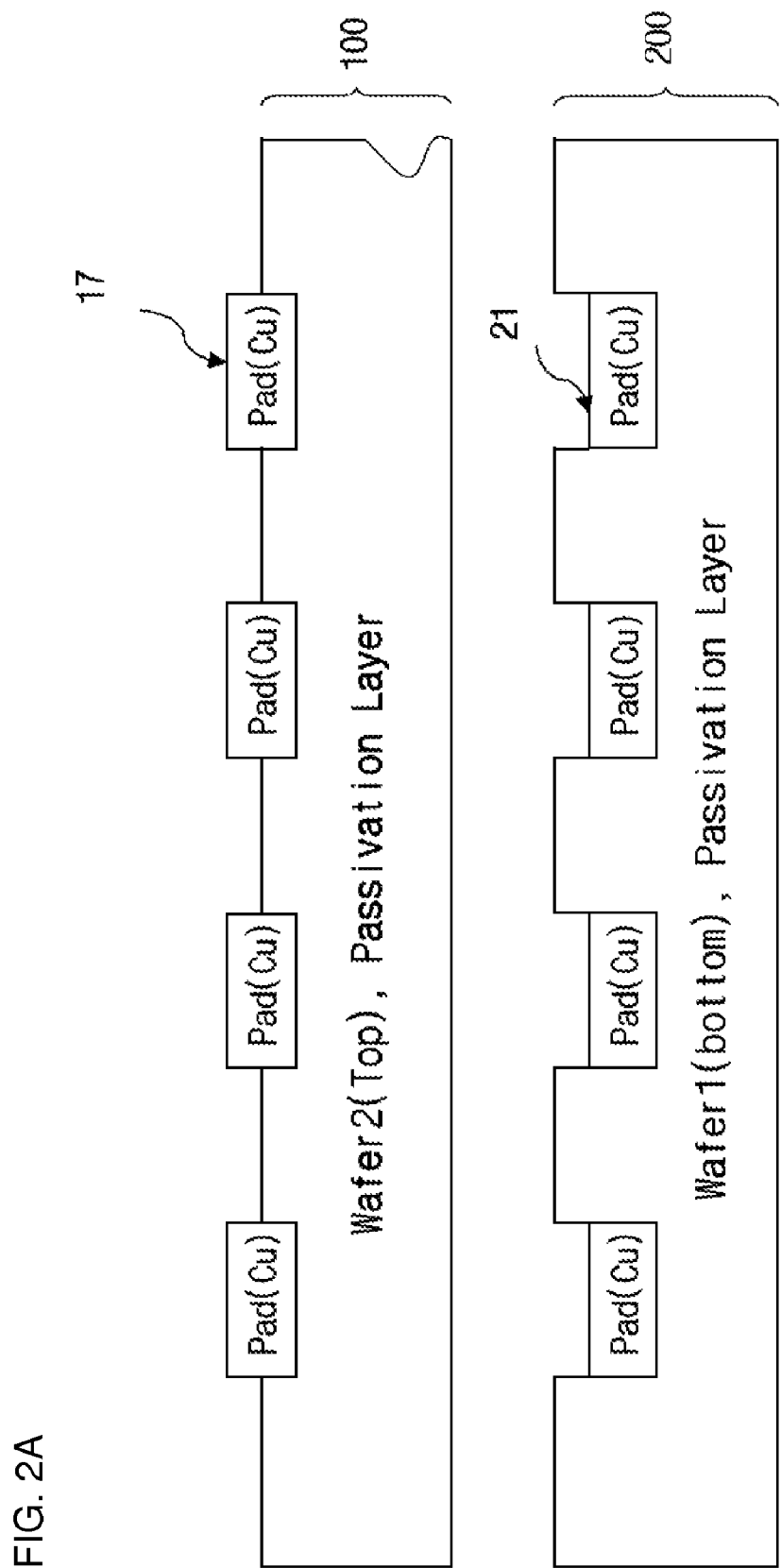

UNIT PIXEL OF IMAGE SENSOR HAVING THREE-DIMENSIONAL STRUCTURE AND METHOD FOR MANUFACTURING THE SAME

BACKGROUND OF THE INVENTION

1. Field of the Invention

The present invention relates to a unit pixel of an image sensor, and more particularly, to a unit pixel of an image sensor having a three-dimensional structure, which has a transistor and a photodiode, and a method for manufacturing the same.

2. Description of the Related Art

Referring to Korean Patent No. 10-0782463 entitled "Separation type unit pixel of image sensor having 3 dimensional structure and manufacture method thereof", in order to increase a fill factor as a ratio between the area occupied by a photodiode and the size of a pixel, a wafer, in which a photodiode is formed, and a wafer, in which other circuit components are formed, are separately manufactured and are bonded to each other by way of conductive pads. As an alignment (arrangement) method for bonding the wafers, infrared (IR) irradiation, etching and laser punching are used.

FIG. 1 is a photograph showing the cross-section of a wafer when a TSV (through-silicon via) process is conducted as a generally-used method for aligning wafers.

In the TSV process, through-silicon vias are defined narrowly and long through silicon in order to electrically connect top and bottom wafers and define upwardly facing electrodes. The through-silicon vias are also used as the origin of coordinates for alignment.

As shown in the drawing, in a semiconductor manufacturing process, design is made such that the through-silicon via has a high aspect ratio, that is, a diameter of 2.5 μm and a height of 55 μm. In the TSV process, etching and filling are difficult to conduct, and uniformity and repeatability during aligning wafers are likely to deteriorate depending upon chips or wafers.

Further, in a super via (contact) method and an infrared irradiation method, which are used in the conventional art as an alignment (arrangement) method for bonding wafers, problems are caused in that processing is involved and the precision of the alignment may be degraded.

SUMMARY OF THE INVENTION

Accordingly, the present invention has been made in an effort to solve the problems occurring in the related art, and an object of the present invention is to provide a unit pixel of an image sensor having a three-dimensional structure, which can allow alignment of chips during the manufacture of an image sensor to be easily and precisely implemented with respect to sideward movement and rotation while obviating the need for a separate device for alignment, and a method for manufacturing the same.

In order to achieve the above object, according to one aspect of the present invention, there is provided a unit pixel of an image sensor having a three-dimensional structure, including a first chip and a second chip which are stacked, one of the first chip and the second chip having a photodiode and the other of the first chip and the second chip having a circuit for receiving information from the photodiode and outputting received information, the unit pixel comprising the first chip including a first pad which is projectedly disposed on an upper surface of the first chip in such a way as to define a concavo-convex structure; and the second chip including a second pad which is depressedly disposed on an upper surface of the second chip in such a way as to define a concavo-convex structure corresponding to the concavo-convex structure of the first chip, wherein the first chip and the second chip are mated with each other through bonding of the first pad and the second pad.

In order to achieve the above object, according to another aspect of the present invention, there is provided a method for manufacturing a unit pixel of an image sensor having a three-dimensional structure, including a first chip and a second chip which are stacked, one of the first chip and the second chip having a photodiode and the other of the first chip and the second chip having a circuit for receiving information from the photodiode and outputting received information, the method comprising the steps of (a) preparing the first chip including a first pad which is projectedly disposed on an upper surface of the first chip in such a way as to define a concavo-convex structure and the second chip including a second pad which is depressedly disposed on an upper surface of the second chip in such a way as to define a concavo-convex structure corresponding to the concavo-convex structure of the first chip; (b) facing the first pad of the first chip and the second pad of the second chip; (c) aligning the first chip and the second chip such that the first pad of the first chip and the second pad of the second chip are mated with each other; and (d) bonding the first pad of the first chip and the second pad of the second chip which are mated with each other.

BRIEF DESCRIPTION OF THE DRAWINGS

The above objects, and other features and advantages of the present invention will become more apparent after a reading of the following detailed description taken in conjunction with the drawings, in which:

FIGS. 2a through 2c are cross-sectional views illustrating main processes associated with the alignment of an image sensor according to the present invention;

DETAILED DESCRIPTION OF PREFERRED EMBODIMENTS

Figure 1:
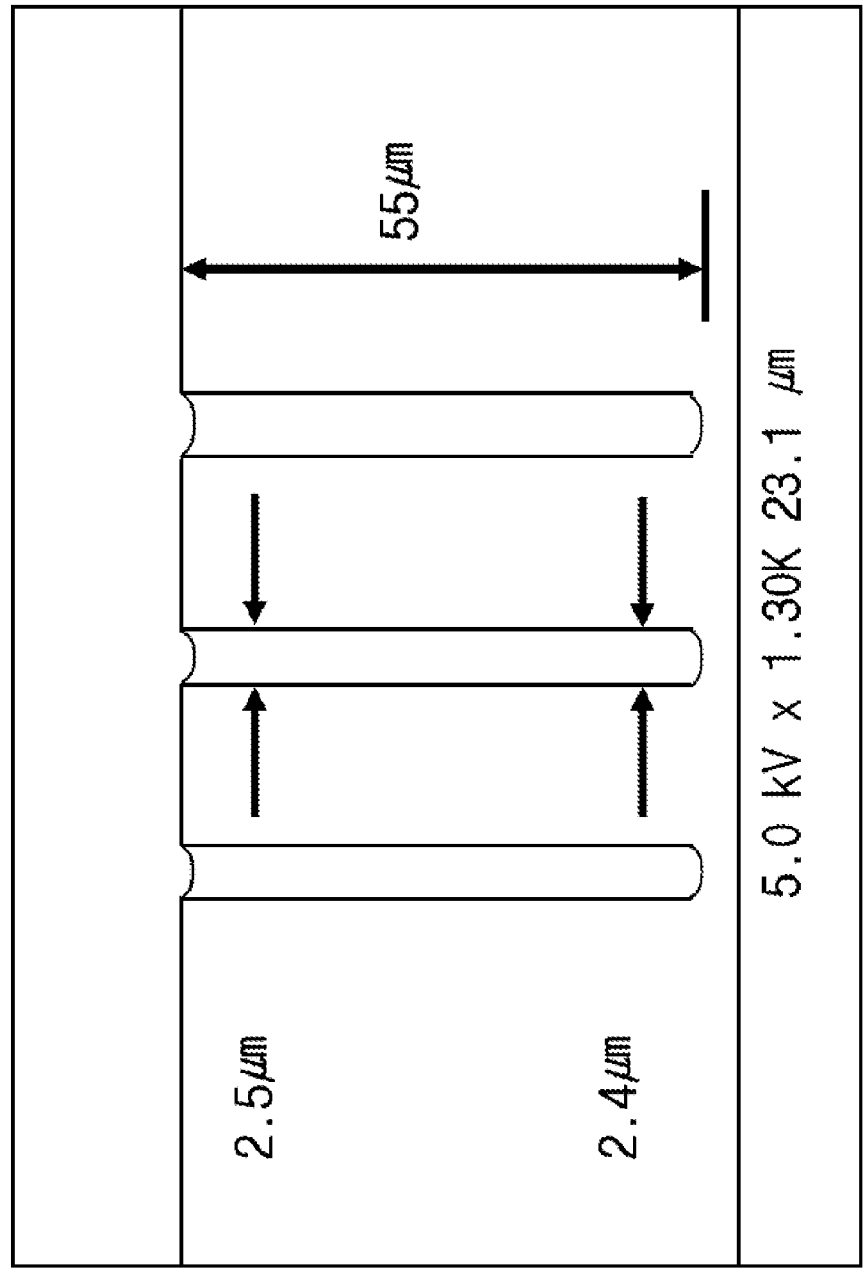
FIG. 1 is a photograph showing the cross-section of a wafer when a TSV (through-silicon via) process is conducted.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2B:
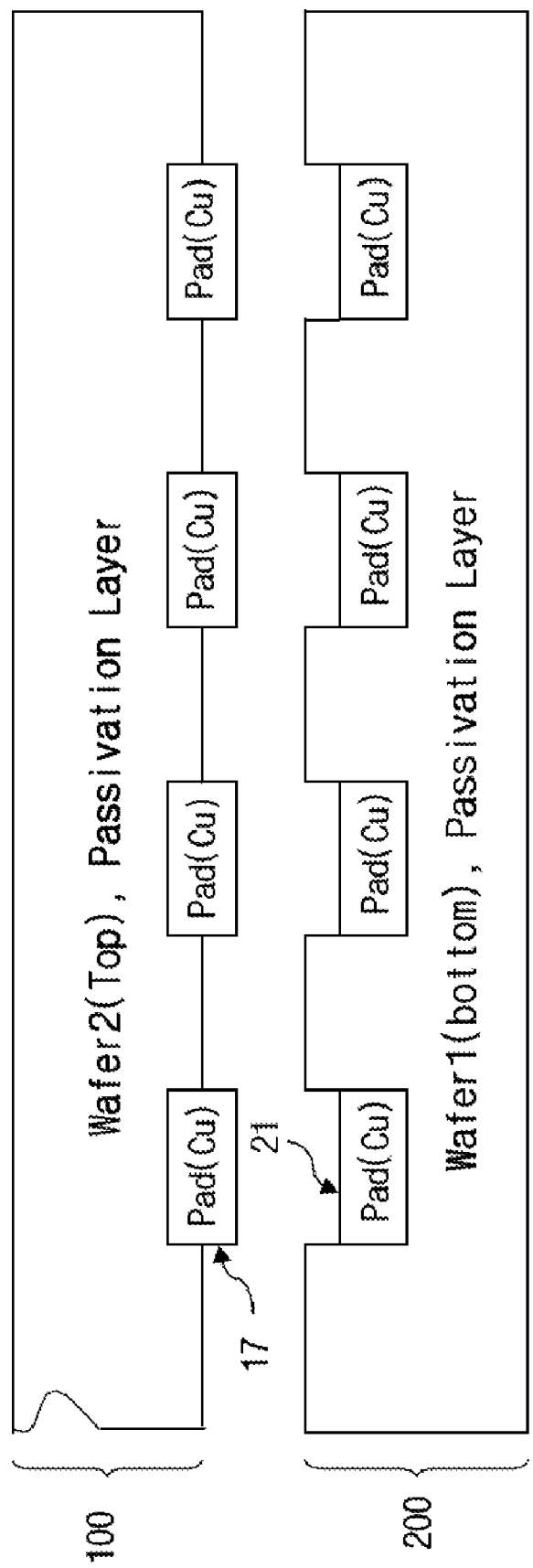
Figure 2C:
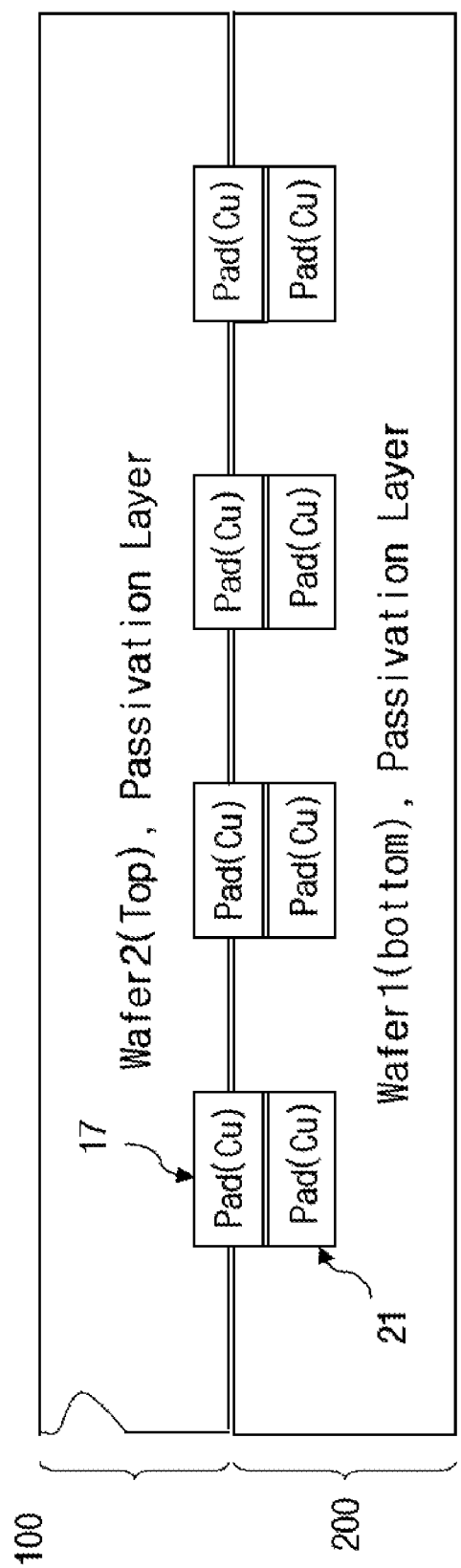

FIGS. 2a through 2c are cross-sectional views illustrating main processes associated with the alignment of wafers on which a unit pixel of an image sensor having a three-dimensional structure according to the present invention is stacked.

First, referring to FIG. 2a, electrode pads 17 and 21 are respectively formed on a first wafer 100 and a second wafer 200.

The first wafer 100 is formed with a plurality of first pads 17 which project from the upper surface of the first wafer 100 in such a way as to define a concavo-convex structure. The second wafer 200 is formed with a plurality of second pads 21 which are depressed from the upper surface of the second wafer 200 in such a way as to define a concavo-convex structure corresponding to that of the first wafer 100.

The concavo-convex structures of the first wafer 100 and the second wafer 200 can be realized by a CMP (chemical mechanical polishing) process or a separate masking and etching process.

The second pads 21 are formed in grooves which are defined by etching the passivation layer of the second wafer 200. The stepped portions of the passivation layer can be formed up to 0.01 to 5 $\mu$m. If the stepped portions is less than 0.01 $\mu$m, alignment using the stepped portions of the pads may be difficult.

Second, referring to FIG. 2b, the first wafer 100 is placed over the second wafer 200 such that the first pads 17 and the second pads 21 face each other.

Third, referring to FIG. 2c, the first wafer 100 or the second wafer 200 is moved sideward until the first pads 17 of the first wafer 100 are mated with the second pads 21 of the second wafer 200. If the two wafers 100 and 200 are mated with each other, the first pads 17 and the second pads 21 are registered with each other in all directions. The conductors of the first pads 17 and the conductors of the second pads 21 are bonded to each other by applying thermal energy.

In the present invention, similarly to the case of assembling LEGO toys, with the edges of the first wafer 100 and the second wafer 200 roughly aligned with each other, by moving the wafers 100 and 200 sideward, the first and second wafers 100 and 200 can be registered with each other like male and female saw teeth. Therefore, even without using separate keys or patterns, the first wafer 100 and the second wafer 200 can be aligned with each other using only the stepped portions of the first pads 17 and the second pads 21.

Figure 3:
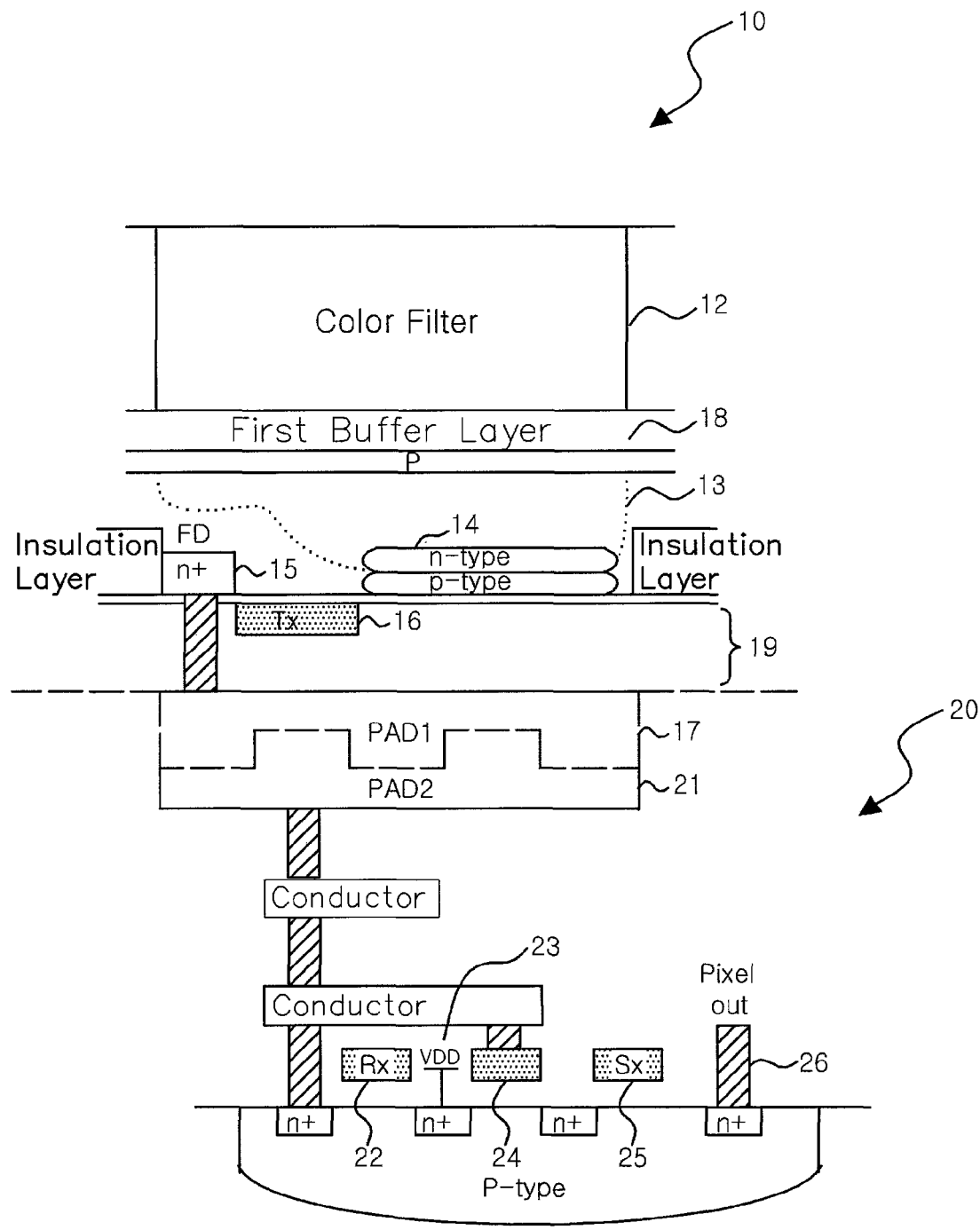
FIG. 3 is a cross-sectional view illustrating a unit pixel of an image sensor having a three-dimensional structure in accordance with an embodiment of the present invention.

FIG. 3 is a cross-sectional view illustrating a unit pixel of an image sensor having a three-dimensional structure in accordance with an embodiment of the present invention. The unit pixel is divisionally composed of a first chip 10 and a second chip 20.

The first wafer 100 shown in FIG. 2a has a plurality of first chips 10, and the second wafer 200 has a plurality of second chips 20. Thus, by bonding the first wafer 100 and the second wafer 200, a plurality of image sensors can be manufactured.

Describing a detail configuration, the first chip 10 includes first pads 17 for connection with the signals of the second chip 20, a color filter 12, a photodiode 14, a transmission transistor 16, and a floating diffusion area 15 which serves as static electricity to convert an amount of charges into a voltage.

The second chip 20 includes second pads 21 for receiving the signals of the first chip 10, a reset transistor 22 for initializing the photodiode 14, a voltage supply source 23, a source follow transistor 24 for transferring the voltage state of the floating diffusion area 15 as a floating node to an outside, a select transistor 25 for controlling whether to connect the information of the image sensor to an external read-out circuit, and a final output electrode 26 of the image sensor.

Figure 4A:
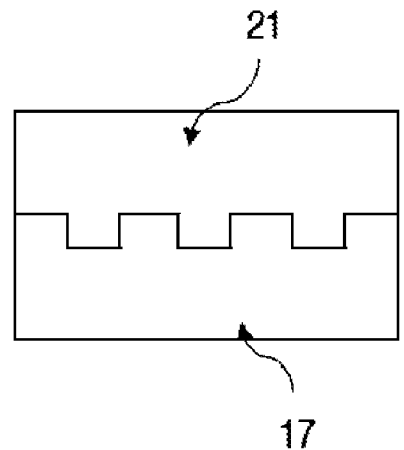
FIGS. 4A) through 4C) are cross-sectional views showing exemplary sectional shapes of first pads and second pads.

FIGS. 4A) through 4C) are cross-sectional views showing exemplary sectional shapes of first pads and second pads.

In FIG. 4A), the first pads 17 have prominences which are spaced apart by a predetermined gap and have a rectangular sectional shape to define the concavo-convex structure, and the second pads 21 have depressions which are mated with the first pads 17 to define the concavo-convex structure corresponding to that of the first pads 17.

Figure 4B:
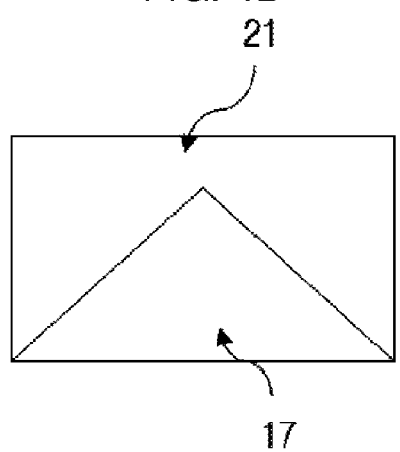
Figure 4C:
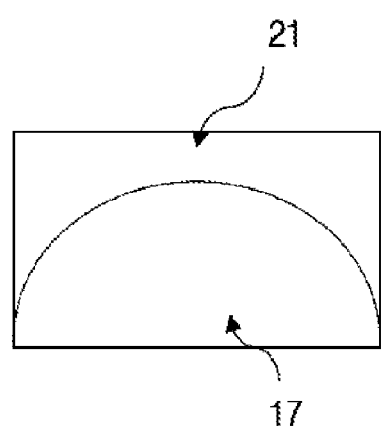

In FIGS. 4B) and 4C), the first pads 17 have prominences which have triangular and semicircular sectional shapes to define the concavo-convex structure, and the second pads 21 have depressions which have the sectional shapes corresponding to the triangular and semicircular prominences to define the concavo-convex structure corresponding to that of the first pads 17.

The first pads 17 and the second pads 21 can be realized by simple rectangular sectional shapes (see FIGS. 2a through 2c) or by modified sectional shapes (see FIG. 3 and FIGS. 4A) through 4C)).

Figure 5:
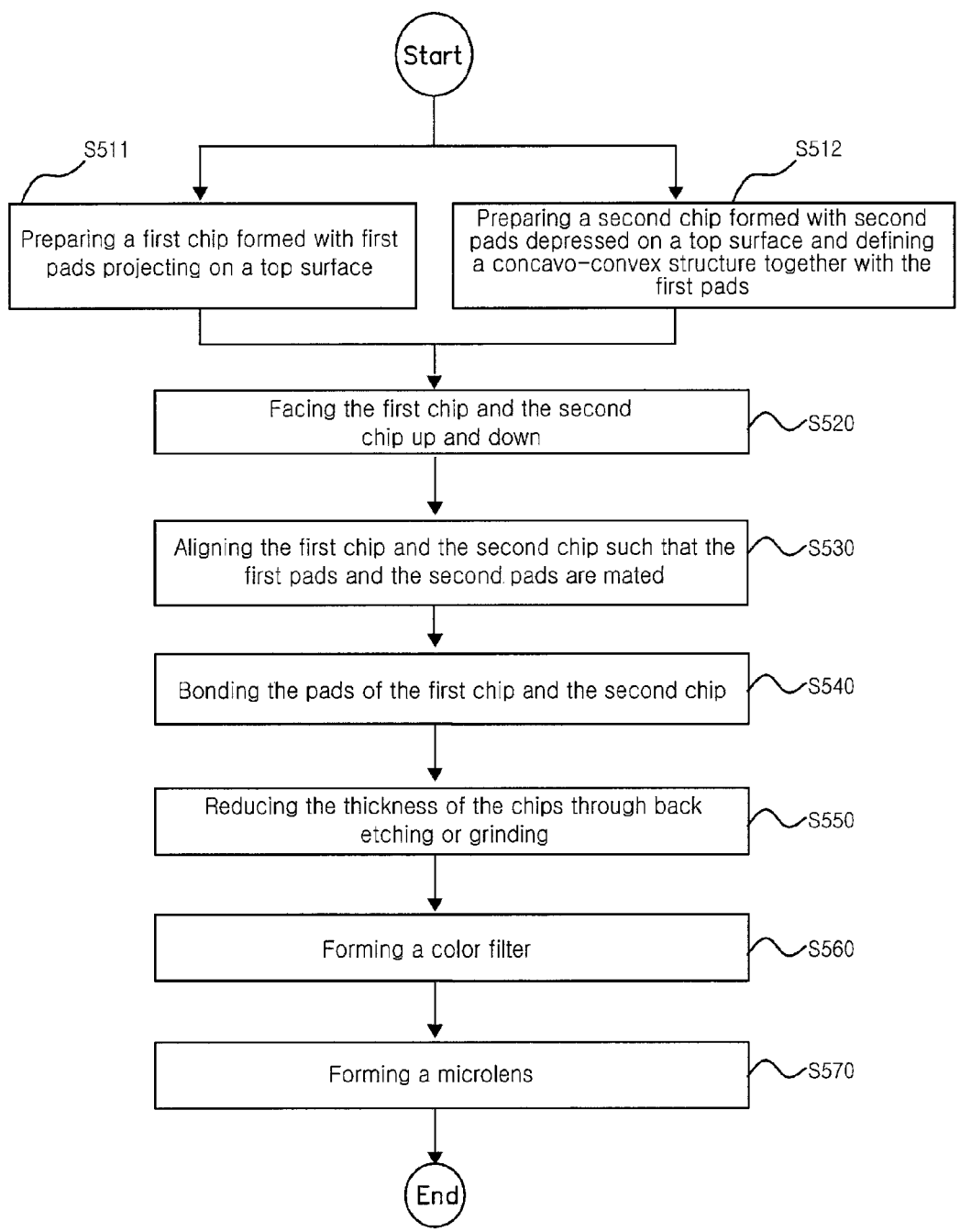
FIG. 5 is a flow chart illustrating a method for manufacturing a unit pixel of an image sensor having a three-dimensional structure in accordance with another embodiment of the present invention.

FIG. 5 is a flow chart illustrating a method for manufacturing a unit pixel of an image sensor having a three-dimensional structure in accordance with another embodiment of the present invention.

In a first step, a first chip, which has first pads projectedly formed on the upper surface of the first chip to define a concavo-convex structure, is prepared (S511).

At the same time with the preparation of the first chip, a second chip, which has second pads depressed on the upper surface of the second chip to define a concavo-convex structure corresponding to that of the first pads, is prepared (S512).

The concavo-convex structure of each of the first chip 10 and the second chip 20 can be realized by a separate masking and etching process or a CMP process.

In a second step, the first chip and the second chip are placed in a manner such that the pads of the first chip and the second chip face each other (S520).

In a third step, the first chip and the second chip are aligned in a manner such that the pads of the first chip and the second chip are mated with each other along the concavo-convex structures thereof (S530).

In order to align the first chip and the second chip, any one of the conventional alignment methods including infrared irradiation, etching and laser punching in which wafers are optically aligned up and down by defining through-silicon vias through predetermined portions of the wafers can be additionally used together with the present alignment method using the pads.

In a fourth step, the conductive pads of the aligned first and second chips are bonded to each other (S540).

For example, by supplying thermal energy, the first pads and the second pads are bonded to each other.

In a fifth step, in order to make thin the back side of the first chip, the thickness of the back side of the wafer (or the chip) is decreased (S550).

In a sixth step, a color filter is formed on the first chip (S560).

In a seventh step, a microlens is formed on the color filter (S570).

Figure 6A:
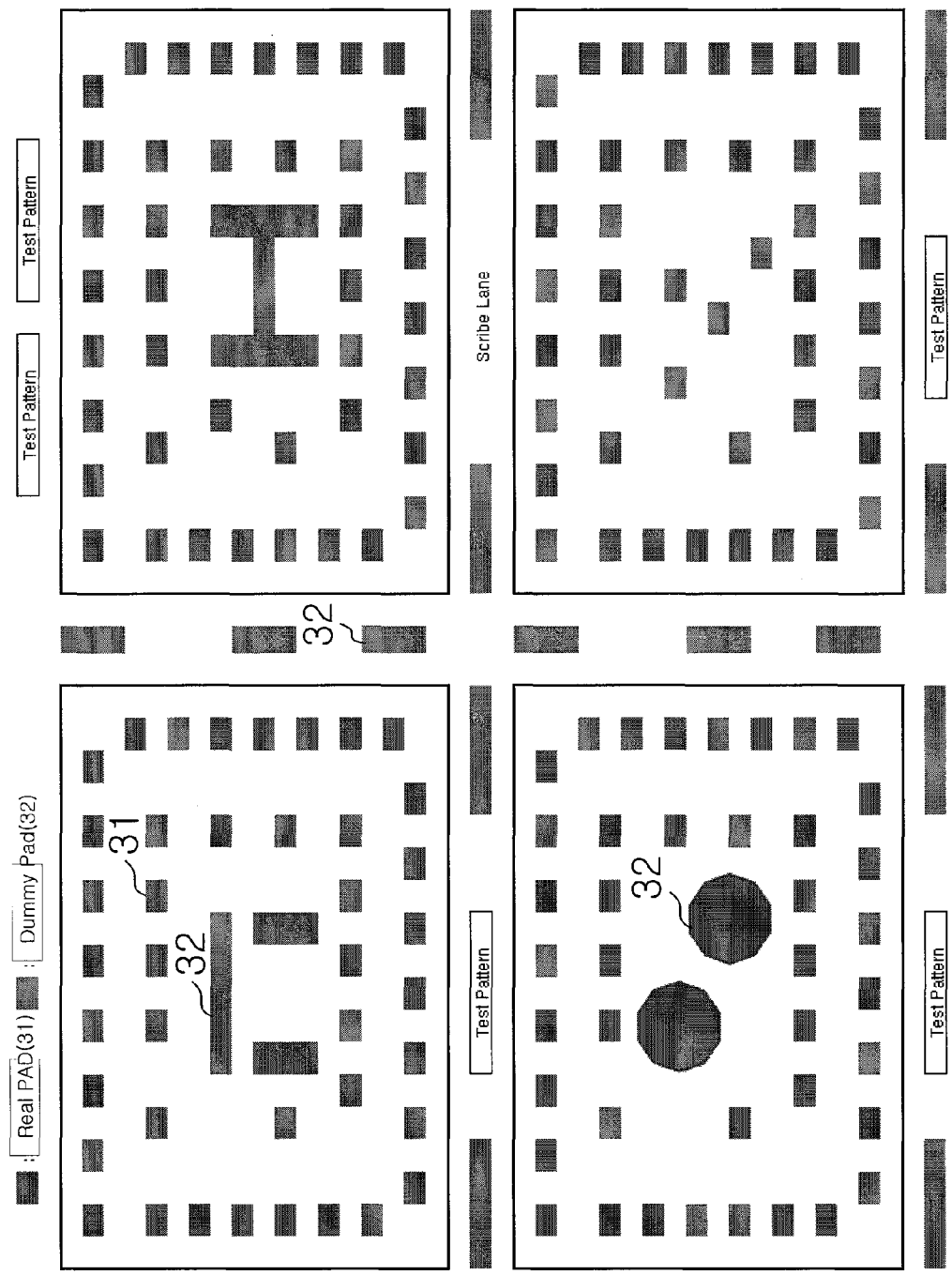
FIGS. 6a and 6b are views illustrating exemplary disposal of a plurality of pads and dummy pads of the unit pixel of an image sensor having a three-dimensional structure according to the present invention.
Figure 6B:
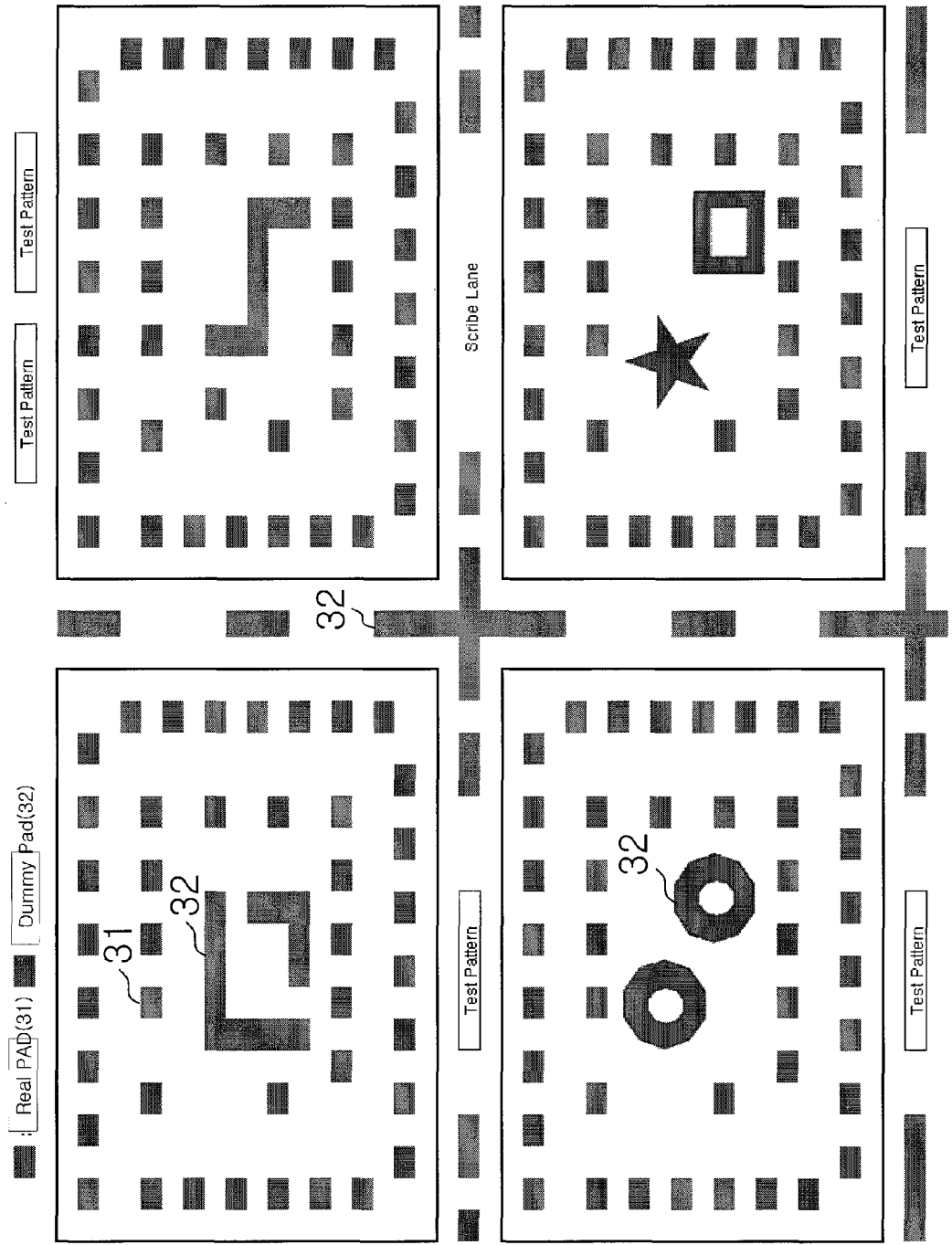

FIGS. 6a and 6b are views illustrating exemplary disposal of a plurality of pads and dummy pads of the unit pixel of an image sensor having a three-dimensional structure according to the present invention.

FIGS. 6a and 6b illustrate pads 31 which actually connect the signals of a first chip and the signals of a second chip and dummy pads 32 which are used for a testing purpose or for bonding the first chip and the second chip.

In the present invention, in order to align the first chip and the second chip, in addition to the pads 31, the dummy pads 32 can be used as alignment keys. As shown in the drawings, in the present invention, by forming the dummy pads 32 into a specified shape such as a star or polygonal shape so that chips cannot be mated with each other unless dummy pads designed to be connected with the corresponding dummy pads are used, the alignment precision can be improved when compared to the conventional art. Accordingly, as the dummy pads are formed to have specified shapes, the possibility of misalignment upon sideward movement or rotation of the wafers or chips can be decreased.

The dummy pads having a specified shape can also be formed on scribe lanes to be used for an alignment purpose.

The method for manufacturing a separation type unit pixel of a three dimensional image sensor according to the present invention is not limited to a CMOS process and can also be used in other semiconductor manufacturing processes.

As is apparent from the above description, the present invention provides advantages in that, since conductive pads of chips are aligned such that the conductive pads of a first chip can be fitted into a specified shape of the conductive pads of a second chip, the alignment can be easily and precisely implemented, and the need for a separate test pattern for the alignment or an alignment key or a separate equipment for recognizing the alignment can be eliminated, whereby the manufacturing cost can be reduced.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a unit pixel of an image sensor having a three-dimensional structure, including a first chip and a second chip which are stacked, one of the first chip and the second chip having a photodiode and the other of the first chip and the second chip having a circuit for receiving information from the photodiode and outputting received information, the method comprising the steps of:
 (a) preparing the first chip including a first pad which is disposed on and projected out from an upper surface of the first chip in such a way as to define a concavo-convex structure and the second chip including a second pad which is disposed on and depressed into an upper surface of the second chip in such a way as to define a concavo-convex structure corresponding to the concavo-convex structure of the first chip;
 (b) facing the first pad of the first chip and the second pad of the second chip;
 (c) aligning the first chip and the second chip such that the first pad of the first chip and the second pad of the second chip are mated with each other; and
 (d) bonding the first pad of the first chip and the second pad of the second chip which are mated with each other.

2. The method according to claim 1, wherein the step (d) includes the step of:
 (e) coupling the first pad and the second pad through supply thermal energy.

3. The method according to claim 1, wherein the step (c) includes the step of:
 (f) aligning the first chip and the second chip using any one method among infrared irradiation, etching and laser punching.

4. A unit pixel of an image sensor having a three-dimensional structure, including a first chip and a second chip which are stacked, one of the first chip and the second chip having a photodiode and the other of the first chip and the second chip having a circuit for receiving information from the photodiode and outputting received information, the unit pixel comprising:
 the first chip including a first pad which is disposed on and projected out from an upper surface of the first chip in such a way as to define a concavo-convex structure; and
 the second chip including a second pad which is disposed on and depressed into an upper surface of the second chip in such a way as to define a concavo-convex structure corresponding to the concavo-convex structure of the first chip,
 wherein the first chip and the second chip are mated with each other through bonding of the first pad and the second pad.

5. The unit pixel of the image sensor having the three-dimensional structure according to claim 4, wherein the second pad is formed on a passivation layer, a region of the passivation layer in which the second pad is formed and a region of the passivation layer in which the second pad is not formed define stepped portions, and the stepped portions have a size of 0.01 to 5 μm.

6. The unit pixel of the image sensor having the three-dimensional structure according to claim 4, wherein a sectional shape of the first pad includes any one of the concavo-convex structure, a semicircle and a triangle.

7. The unit pixel of the image sensor having the three-dimensional structure according to claim 4, wherein a surface of the first pad has a shape of any one among a polygon, a circle and a star.

8. The unit pixel of the image sensor having the three-dimensional structure according to claim 4, wherein the first chip includes the photodiode, a transmission transistor, a color filter, and a floating diffusion area which serves as static electricity to convert an amount of charges into a voltage.

9. The unit pixel of the image sensor having the three-dimensional structure according to claim 8, wherein the second chip includes a reset transistor for initializing the photodiode, a voltage supply source, a source follow transistor for transferring a voltage state of the floating diffusion area to an outside, a select transistor for controlling whether to connect information of the image sensor to an external read-out circuit, and a final output electrode of the image sensor.

10. The unit pixel of the image sensor having the three-dimensional structure according to claim 4, wherein each of the first pad and the second pad is composed of a plurality of pads.

11. The unit pixel of the image sensor having the three-dimensional structure according to claim 10, wherein each of the first pad and the second pad includes at least one dummy pad.

12. The unit pixel of the image sensor having the three-dimensional structure according to claim 11, wherein the dummy pad is formed on a scribe lane.

13. The unit pixel of the image sensor having the three-dimensional structure according to claim 11, wherein a surface of the first pad has a shape of any one among a polygon, a circle and a star.

* * * * *